US 6,619,787 B2

(12) United States Patent
Zhang et al.

(10) Patent No.: US 6,619,787 B2
(45) Date of Patent: Sep. 16, 2003

(54) LIMITING UNWANTED INK PENETRATION OF FLEXIBLE CIRCUITS OF FLUID EJECTION DEVICES

(75) Inventors: Yi Zhang, Escondido, CA (US); Glenn T. Haddick, San Diego, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/003,676

(22) Filed: Oct. 31, 2001

(65) Prior Publication Data

US 2003/0081065 A1 May 1, 2003

(51) Int. Cl.⁷ .................................................. B41J 2/01
(52) U.S. Cl. ...................................................... 347/50
(58) Field of Search .............................. 347/50, 85, 86, 347/87; 439/67

(56) References Cited

U.S. PATENT DOCUMENTS

| 5,278,584 | A | * | 1/1994 | Keefe et al. ................... 347/63 |
| 5,315,472 | A | * | 5/1994 | Fong et al. ................... 361/212 |
| 6,265,782 | B1 | * | 7/2001 | Yamamoto et al. .......... 257/783 |
| 6,314,660 | B1 | * | 11/2001 | Dangelewicz et al. ........ 34/616 |

* cited by examiner

*Primary Examiner*—Michael Nghiem

(57) ABSTRACT

The present invention includes as one embodiment a fluid ejection device for printing ink on a print media, including a flexible circuit with electrical traces, a coverlayer covering the electrical traces and adhering the flexible circuit to the fluid ejection device and at least one mechanical feature located on an outer edge of the flexible circuit near the electrical traces.

17 Claims, 4 Drawing Sheets

LIMITING UNWANTED INK PENETRATION OF FLEXIBLE CIRCUITS OF FLUID EJECTION DEVICES

FIELD OF THE INVENTION

One embodiment of the present invention generally relates to printers, and in particular, to a system and method for limiting unwanted ink penetration through an interface between a coverlayer and a flexible circuit to electrical traces of the flexible circuit.

BACKGROUND OF THE INVENTION

One part during the manufacturing of an inkjet print cartridge typically includes adhesively bonding a thermal inkjet head assembly (THA) to the cartridge. The THA assembly typically consists of a semiconductor die, a flexible circuit and interconnect pads.

However, inadvertent bending and/or buckling due to structural thermal expansions and contractions can occur during adhesive sealing. For example, during heat, cure and cooling, the cartridge experiences thermal expansions and contractions. Consequently, these thermal expansions and contractions can cause buckling, bending and deformity to coverlayer structures.

The coverlayer is an adhesive layer that provides the bonding between the THA and ink cartridge. Typically, this is a sandwich type configuration with three layers of material. For example, a thermal plastic adhesive, such as a co-polymer resin, comprises the outer layers and a PET (polyethylene terephthalate) acts as the center core layer between the thermal plastic adhesive layers. The function of these layers is to provide protection to the flexible circuit and to bond the THA to the ink cartridge.

Ink that accumulates along the edge of the THA could penetrate through the interface of the coverlayer and THA to an active trace causing an electrical short. Since the coverlayer is a non-permeable material, the normal route of ink penetration is from the side of the coverlayer through to the edge of the ground trace and then to the active trace. Poor adherence of the coverlayer to the flexible circuit means poor circuit protection from ink penetration.

For example, if the adhesive failure causes coverlayer de-bonding from the flexible circuit, it can be exposed to the ink, which can cause the electrical short. Meanwhile, insufficient coverage of the coverlayer beyond circuit layout also means weakened circuit protection. This is because less coverage from the coverlayer leaves a shorter distance for the ink to penetrate through.

Unfortunately, typical printhead headland configurations, especially for smaller printheads, have limited space for coverlayer coverage. Further, electrical requirements do not allow the circuit to be trimmed any narrower to yield more space for extra coverlayer coverage.

SUMMARY OF THE INVENTION

The present invention includes as one embodiment a fluid ejection device for printing ink on a print media, comprising a flexible circuit with electrical traces, a coverlayer covering the electrical traces and adhering the flexible circuit to the fluid ejection device and at least one mechanical feature located on an outer edge of the flexible circuit near the electrical traces.

The present invention as well as a more complete understanding thereof will be made apparent from a study of the following detailed description of the invention in connection with the accompanying drawings and appended claims.

BRIEF DESCRIPTION OF THE DRAWINGS

The embodiments of the present invention can be further understood by reference to the following description and attached drawings that illustrate the preferred embodiment. Other features and advantages will be apparent from the following detailed description of the preferred embodiment, taken in conjunction with the accompanying drawings, which illustrate, by way of example, the principles of the invention.

DETAILED DESCRIPTION OF THE PREFERRED EMBODIMENTS

In the following description of the preferred embodiments, reference is made to the accompanying drawings, which form a part hereof, and in which is shown by way of illustration a specific example in which the invention may be practiced. It is to be understood that other embodiments may be utilized and structural changes may be made without departing from the scope of the present invention.

I. General Overview of Components and Operation

Figure 1:
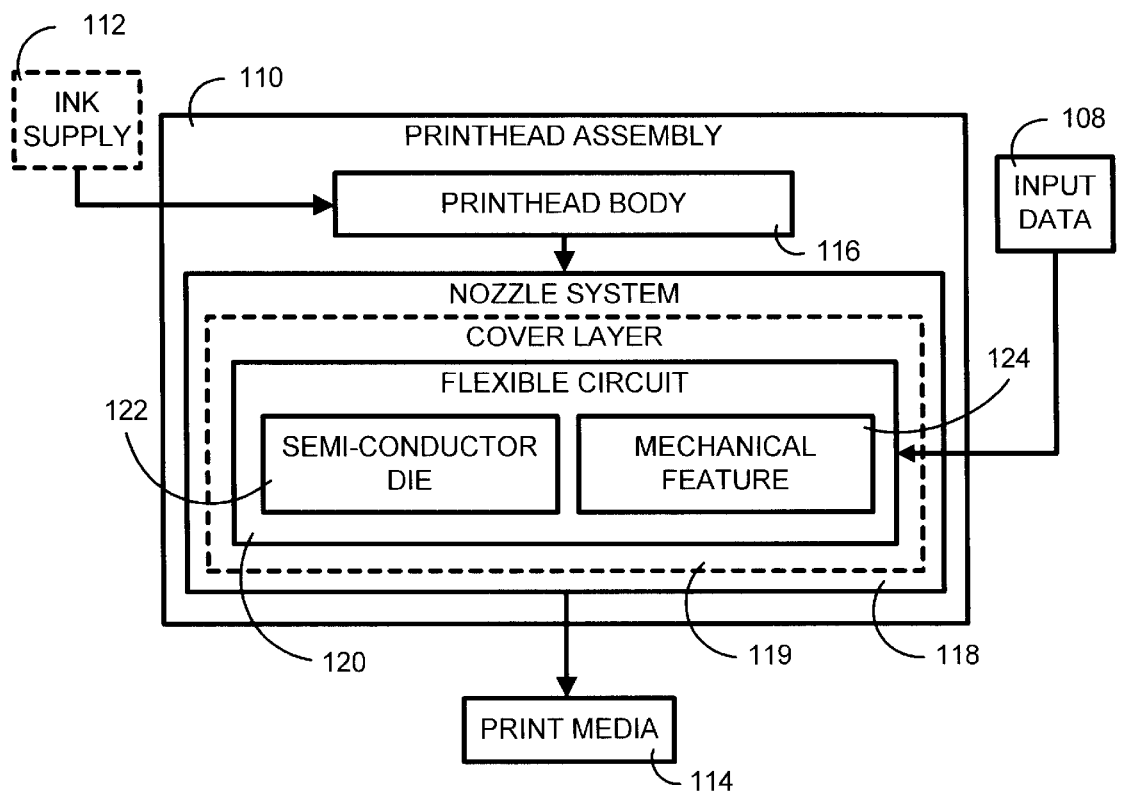
FIG. 1 is one embodiment showing a block diagram of an overall printing system incorporating the present invention.

FIG. 1 shows a block diagram of an overall printing system of one embodiment. The printing system includes input data 108, a printhead assembly 110, an ink supply 112 (shown in dotted lines because it can be located either remotely from or integrated with the printhead 110) and print media 114. The printhead assembly 110, may have 1–n printheads, each of which would include a printhead body 116 and a nozzle system 118.

The printhead body 116 is securely coupled to the nozzle system 118 with an adhesive arrangement. One adhesive arrangement includes a coverlayer 119 that adhesively bonds a flexible circuit 120 to the printhead assembly 110. The flexible circuit 120 couples the input data 108, such as electrical signals and power, to a semiconductor die 122 of the printhead assembly 110. The semiconductor die 122 includes ink ejection elements (not shown), such as resistors for ejecting ink on the print media 114.

During a printing operation, ink is provided from the ink supply 112 to an interior portion (such as an ink reservoir) of the printhead body 116. The interior portion of the printhead body 116 provides ink through ink channels to the nozzle system 118. Namely, the printhead assembly 110 receives commands from the input data 108 to fire the ink ejection elements of the semiconductor die 122 for printing ink as text and images on the print media 114. Print quality of the desired pattern is dependent on accurate placement of the ink droplets on the print media 114.

In one embodiment of the present invention, the flexible circuit 120 is strategically configured with at least one mechanical feature 124, preferably located on an outer edge of the flexible circuit 120 near the electrical traces (not shown). This increases coverage of the coverlayer 119, which yields more space for the coverlayer 119 at certain areas and also limits unwanted ink penetration. As such, the reliability of printheads with size limitations, such as one-inch printheads is increased. In other words, gaining more coverage reduces the possibility of ink penetration through the interface between the coverlayer and the flexible circuit to the electrical traces.

II. Exemplary Printing System

Figure 2:
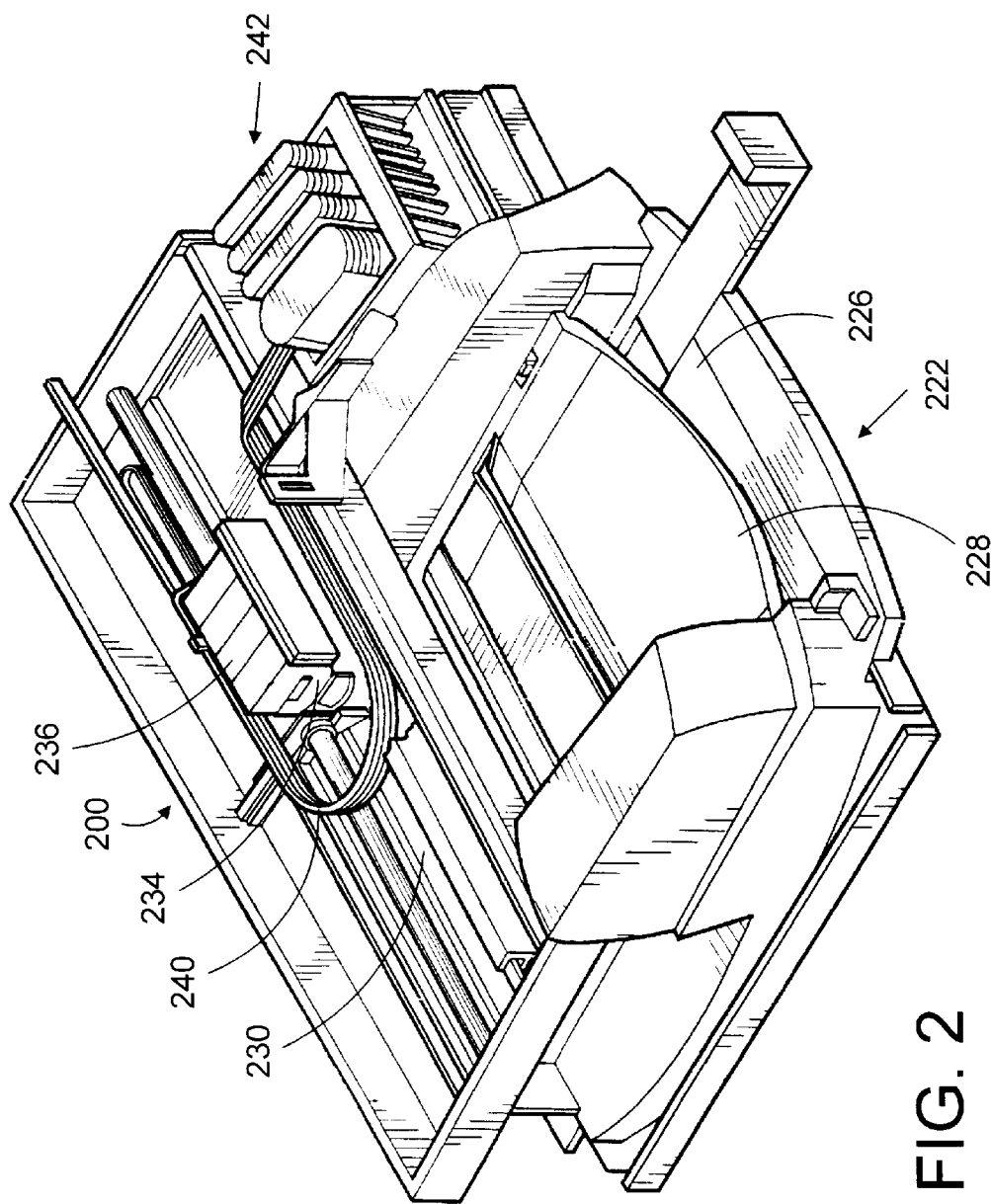
FIG. 2 is one embodiment of an exemplary printer that incorporates the invention and is shown for illustrative purposes only.

FIG. 2 is one embodiment of an exemplary high-speed printer that incorporates an embodiment of the invention and is shown for illustrative purposes only. Generally, printer 200 can incorporate the printhead 110 of FIG. 1 and further include a tray 222 for holding print media. When printing operation is initiated, print media, such as paper, is fed into printer 200 from tray 222 preferably using sheet feeder 226. The sheet is then brought around in a U direction and then travels in an opposite direction toward output tray 228. Other paper paths, such as straight paper path, can also be used.

The sheet is stopped in a print zone 230, and a scanning carriage 234, supporting one or more printhead assemblies 236, is scanned across the sheet for printing a swath of ink thereon. After a single scan or multiple scans, the sheet is then incrementally shifted using, for example a stepper motor or feed rollers to a next position within the print zone 230. Carriage 234 again scans across the sheet for printing a next swath of ink. The process repeats until the entire sheet has been printed, at which point it is ejected into the output tray 228.

The print assemblies 236 can be removeably mounted or permanently mounted to the scanning carriage 234. Also, the printhead assemblies 236 can have self-contained ink reservoirs as the ink supply 120 of FIG. 1. The self-contained ink reservoirs can be refilled with ink for reusing the print assemblies 236. Alternatively, each print cartridge 236 can be fluidically coupled, via a flexible conduit 240, to one of a plurality of fixed or removable ink containers 242 acting as the ink supply 120 of FIG. 1.

Figure 3:
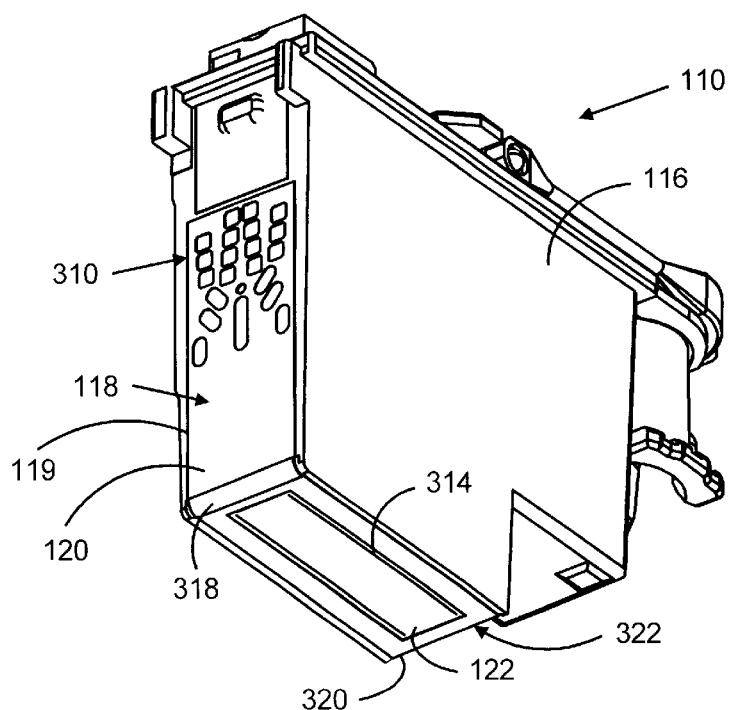
FIG. 3 is one embodiment that shows for illustrative purposes only a perspective view of an exemplary print cartridge incorporating the present invention.

FIG. 3 is one embodiment that shows for illustrative purposes only a perspective view of an exemplary print cartridge (an example of the printhead assembly 110 of FIG. 1) incorporating the present invention. A detailed description of the present invention follows with reference to a typical printhead assembly used with a typical printer, such as printer 200 of FIG. 2. However, the present invention can be incorporated in any printhead and printer configuration.

Referring to FIGS. 1 and 2 along with FIG. 3, the printhead assembly 110 is comprised of the nozzle system 118 (referred to also as a thermal inkjet head assembly—THA) and the printhead body 116. The thermal head assembly 118 includes the flexible circuit 120, which can be a flexible material commonly referred to as a Tape Automated Bonding (TAB) assembly bonded to the printhead 110 via the coverlayer 119. The flexible circuit 120 also includes an interconnect area 310 with interconnect contact pads that align with and electrically contact electrodes (not shown) on carriage 234 of FIG. 2.

Thin film circuitry within the flexible circuit 120 preferably includes digital circuitry that communicates via electrical signals for controlling firing of ink ejection elements (not shown) associated with plural orifices or nozzles 314, which can be created by, for example, laser ablation, for creating ink drop generation.

The thermal head assembly 118 includes a first wrap region 318 between the interconnect area 310 and the semiconductor die 122 where the flexible circuit 120 folds when adhered to the printhead body 116. The thermal head assembly 118 also includes a second wrap region 320 between the semiconductor die 122 and a flexible flap 322 where the flexible circuit 120 also folds when adhered to the printhead body 116. The mechanical feature 124 can be one or a combination of several features (examples discussed below) that are located in close proximity to the wrap regions 318, 320 for increasing coverage of the coverlayer 119 to yield more space for the coverlayer 119 and limit unwanted ink penetration.

III. Details of the Components

Figure 4A:
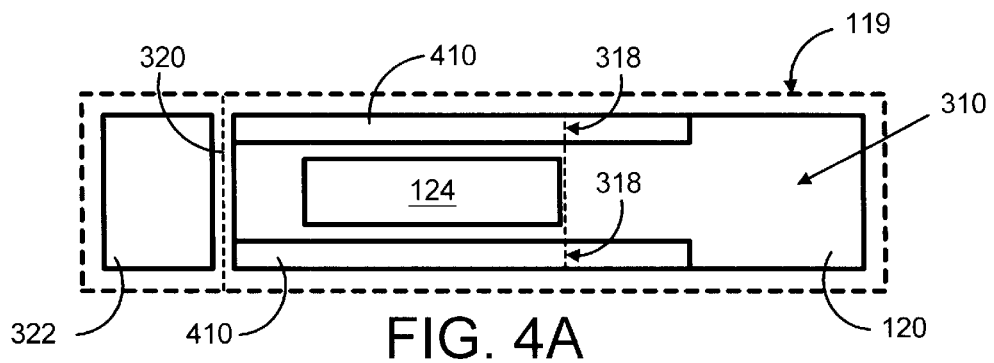
FIGS. 4A and 4B illustrate alternative embodiments of flexible circuits with the mechanical feature.
Figure 4B:
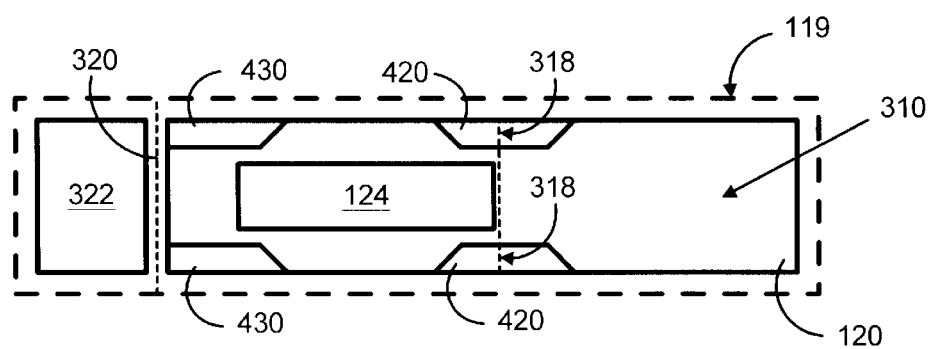

FIGS. 4A and 4B illustrate alternative embodiments of flexible circuits with the mechanical feature. Referring to FIGS. 1 and 3 along with FIG. 4A, the mechanical feature 124 is two notch cuts 410, each extending across the first wrap region 318 to the second wrap region 320 on both sides of the flexible circuit 120 for increasing coverage of the coverlayer 119, which yields more space for the coverlayer 119 and limits unwanted ink penetration.

Referring to FIGS. 1 and 3 along with FIG. 4B, in a preferred embodiment, the mechanical feature 124 is two sets of two notch cuts 420, 430. Namely, the first set of notch cuts 420 extends from past the first wrap region 318 across and past the first wrap region 318 on both sides of the flexible circuit 120, as shown in FIG. 4B. Preferably, the center of the first set of notch cuts 420 is located at the first wrap region 318.

The second set of notch cuts 430 extends from the second wrap region 320 toward the first wrap region 318, but well short of the first wrap region 318, on both sides of the flexible circuit 120, as shown in FIG. 4B. This increases coverage of the coverlayer 119 at specific wrap regions compared to FIG. 4A to yield more space for the coverlayer 119 and limit unwanted ink penetration.

IV. Working Example

After the thermal head assembly 118 is wrapped and attached to an inkjet printhead 110, it is usually under much heavier ink attack at the four corners of the headland than at its mid section. As such, a much higher failure rate of ink penetration at the four corners requires more coverlayer 119 protection to the flexible circuit 120 at these locations. The ink penetration is limited by the embodiments of the present invention.

Figure 5:
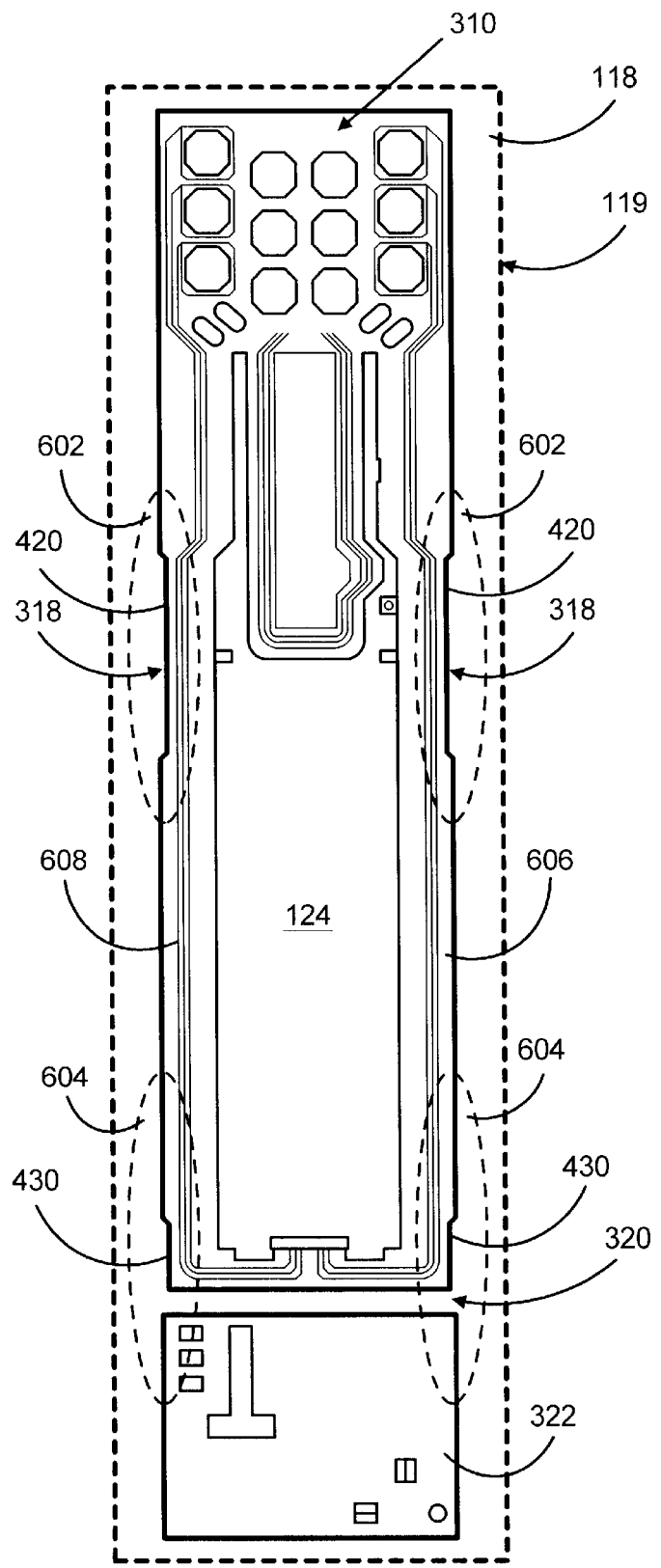
FIG. 5 shows one embodiment of the present invention as a working example for illustrative purposes.

FIG. 5 shows one embodiment of the present invention as a working example for illustrative purposes. Referring to FIGS. 1, 3 and 4B along with FIG. 5, shown is an area 602, 604 where the notch cuts 420, 430, respectively are located in relation to electrical traces 606 and 608. Traces 606 are ground traces that have zero potential and traces 608 are active traces that carry power and electrical signals.

In one embodiment of the present invention, the notch cuts are created during manufacturing of the printhead 110 to improve the adhesion of the coverlayer 119 and to provide more uniform coverage in the above-mentioned areas. Namely, the notch cuts 420, 430 are created in the flexible circuit 120 on outer edges of the ground traces, as shown in FIG. 5. The notch cuts 420, 430 allow the flexible circuit 120 to strategically yield more space for the coverlayer 119 at areas where more coverlayer coverage is needed while keeping the electrical performance of the flexible circuit 120 intact.

The foregoing has described the principles, embodiments and modes of operation of the present invention. However, the embodiments should not be construed as being limited to the particular embodiments discussed. The above-described embodiments should be regarded as illustrative rather than restrictive, and it should be appreciated that variations may be made in those embodiments by workers skilled in the art without departing from the scope of the present invention as defined by the following claims.

What is claimed is:

1. A fluid ejection device with a flexible circuit having electrical traces, comprising:

a coverlayer covering the electrical traces and adhering the flexible circuit to the fluid ejection device; and at least one mechanical feature located on an outer edge of the flexible circuit near the electrical traces where the flexible circuit wraps around the fluid ejection device to limit unwanted ink from penetrating the electrical traces;

wherein the fluid ejection device is approximately one inch in length and wherein the mechanical feature is an indentation cut of the outer edge of the flexible circuit.

2. The fluid ejection device of claim 1, wherein the mechanical feature includes at least one notch cut located on the outer edge of the flexible circuit.

3. The fluid ejection device of claim 2, wherein the at least one notch cut is located is close proximity to an area where the flexible circuit wraps around the fluid ejection device.

4. The fluid ejection device of claim 2, wherein the at least one notch cut includes a first set of notch cuts located in close proximity to where the flexible circuit wraps around the fluid ejection device at a first location and a second set of notch cuts located in close proximity to where the flexible circuit wraps around the fluid ejection device at a second location.

5. The fluid ejection device of claim 2, wherein the at least one notch cut includes a first notch cut that extends from near where the flexible circuit wraps around the fluid ejection device at a first location to near where the flexible circuit wraps around the fluid ejection device at a second location.

6. The fluid ejection device of claim 1, wherein electrical properties of the flexible circuit with the at least one mechanical feature are the same as without the at least one mechanical feature.

7. The fluid ejection device of claim 1, wherein the electrical traces include ground electrical traces and active traces.

8. A method for limiting unwanted ink penetration of a fluid ejection device through an interface between a coverlayer and a flexible circuit to electrical traces of the flexible circuit, comprising:

creating a mechanical feature on an outer edge of the flexible circuit near the electrical traces and at wrap regions of the fluid ejection device to limit unwanted ink from penetrating the electrical traces; and wrapping the flexible circuit around edges and the wrap regions of the fluid ejection device and adhering it with the coverlayer;

wherein the fluid ejection device is approximately one inch in length and wherein the mechanical feature is an indentation cut of the outer edge of the flexible circuit.

9. The method of claim 8, wherein the mechanical feature includes at least one notch cut located on the outer edge of the flexible circuit.

10. The method of claim 9, wherein the at least one notch cut is located is close proximity to an area where the flexible circuit wraps around the fluid ejection device.

11. The method of claim 9, wherein the at least one notch cut includes a first set of notch cuts located in close proximity to where the flexible circuit wraps around the fluid ejection device at a first location and a second set of notch cuts located in close proximity to where the flexible circuit wraps around the fluid ejection device at a second location.

12. The method of claim 9, wherein the at least one notch cut includes a first notch cut that extends from near where the flexible circuit wraps around the fluid ejection device at a first location to near where the flexible circuit wraps around the fluid ejection device at a second location.

13. The method of claim 9, wherein the at least one notch cut is located is close proximity to an area where the flexible circuit wraps around the fluid ejection device.

14. A fluid ejection device for printing ink on a print media, comprising:

a flexible circuit with electrical traces;

a coverlayer covering the electrical traces and adhering the flexible circuit to the fluid ejection device; and a first set of notch cuts located where the flexible circuit wraps around the fluid ejection device at a first location and a second set of notch cuts located where the flexible circuit wraps around the fluid ejection device at a second location to limit unwanted ink from penetrating the electrical traces;

wherein the fluid ejection device is approximately one inch in length and wherein at least one notch cut of said first and second sets of notch cuts is an indentation cut of the outer edge of the flexible circuit.

15. The fluid ejection device of claim 14, wherein the first and second set of notch cuts include notch cuts located on both sides of the flexible circuit that extend from near where the flexible circuit wraps around the fluid ejection device at a first location to near where the flexible circuit wraps around the fluid ejection device at a second location.

16. The fluid ejection device of claim 14, wherein electrical properties of the flexible circuit with the at least one mechanical feature are the same as without the at least one mechanical feature.

17. The fluid ejection device of claim 14, wherein the electrical traces include ground electrical traces and active traces.

* * * * *

UNITED STATES PATENT AND TRADEMARK OFFICE
CERTIFICATE OF CORRECTION

PATENT NO.     : 6,619,787 B2
DATED          : September 16, 2003
INVENTOR(S)    : Zhang et al.

It is certified that error appears in the above-identified patent and that said Letters Patent is hereby corrected as shown below:

<u>Column 5,</u>
Line 22, after "located" delete "is" and insert in lieu thereof -- in --;

<u>Column 6,</u>
Line 8, after "located" delete "is" and insert in lieu thereof -- in --;
Line 23, after "located" delete "is" and insert in lieu thereof -- in --.

Signed and Sealed this

Eighteenth Day of November, 2003

JAMES E. ROGAN
*Director of the United States Patent and Trademark Office*